(12) United States Patent
Chang

(10) Patent No.: US 6,838,345 B2
(45) Date of Patent: Jan. 4, 2005

(54) SIN ROM AND METHOD OF FABRICATING THE SAME

(75) Inventor: Kent Kuohua Chang, Taipei (TW)

(73) Assignee: Macronix International Co., Ltd., Hsinchu (TW)

(*) Notice: Subject to any disclaimer, the term of this patent is extended or adjusted under 35 U.S.C. 154(b) by 149 days.

(21) Appl. No.: 10/248,165

(22) Filed: Dec. 23, 2002

(65) Prior Publication Data
US 2004/0121542 A1 Jun. 24, 2004

(51) Int. Cl.⁷ .......................................... H01L 21/336
(52) U.S. Cl. .................. 438/261; 438/287; 438/288; 438/289; 438/294
(58) Field of Search ................. 438/257, 258, 438/241, 287–9, 294

(56) References Cited

U.S. PATENT DOCUMENTS 6,649,971 B1 * 11/2003 Yeh et al. .................. 257/321

2004/0119108 A1 * 6/2004 Chang ....................... 257/315

* cited by examiner

Primary Examiner—Richard Elms
Assistant Examiner—Beth E. Owens
(74) Attorney, Agent, or Firm—Jiang Chyun IP Office

(57) ABSTRACT

A fabrication method for a silicon nitride read only memory includes sequentially forming a tunneling oxide layer and a charge capture layer on a substrate. An isolation region is formed in the charge capture layer to partition the charge capture layer into a plurality of charge capture blocks. A stacked dielectric layer is then formed on the charge capture layer and the isolation region. Thereafter, the stacked dielectric layer and the charge capture layer are patterned to expose regions of the substrate for forming bit lines, followed by forming a field oxide layer and a control gate. A step of threshold voltage adjustment is subsequently performed such that the channel regions under the charge capture blocks are implanted to adjust the threshold voltages thereof 19 Claims, 9 Drawing Sheets

SIN ROM AND METHOD OF FABRICATING THE SAME

BACKGROUND OF INVENTION

1. Field of the Invention

The present invention relates in general to a non-volatile memory, and more particularly, to a silicon nitride (SiN) read only memory (ROM) and the method of fabricating the same.

2. Description of the Related Art

The electrically erasable programmable read only memory (EEPROM) is a non-volatile memory that provides multiple data saving, reading, and erasing operations. The saved data will not disappear because of power interruption. Therefore, it has been broadly applied in personal computer and electronic equipment.

The typical EEPROM uses doped polysilicon to form a floating gate and a control gate. The electrons injected into the floating gate are uniformly distributed all over the floating gate. However, if a defect exists in the tunneling oxide layer under the floating gate, current leakage easily occurs affecting reliability of the device.

To resolve the EEPROM current leakage problem, a charge capture layer is used to replace the polysilicon floating gate. The material of the charge capture layer is silicon nitride. The silicon nitride charge capture layer normally has one silicon oxide layer on both sides of the silicon nitride layer stacked together to form a stacked gate structure of silicon oxide/silicon nitride/silicon oxide (ONO). The EEPROM including such stacked gate structure is typically referred to as the silicon nitride read only memory (NROM). When a voltage is applied to the control gate and the source/drain region for programming, hot electrons are generated in the channel near the drain region and injected to the charge capture layer. As silicon nitride has the electron capture characteristic, the electrons will not be uniformly distributed all over the charge capture layer, but are concentrated in a local area of the charge capture layer. As the electrons are injected into and trapped in the local area of the charge capture layer, the device is thus less sensitive to a defect of the tunneling oxide layer, such that leakage current is less likely to occur.

The other programming advantage of the NROM includes storing electrons in the silicon nitride layer at the side of the source/drain region by supplying higher voltage at the source/drain region at one side of the stacked gate. On the other hand, electrons can also be saved in the silicon nitride layer near the source/drain region at the other side of the stacked gate. Therefore, by adjusting the voltage applied to the source/drain regions at two sides of the control gate, the single silicon layer can store two groups of electrons, a single of electrons or no electrons. Therefore, four states can be written in a single memory cell to function as a non-volatile memory cell with 2 bits per cell.

However, while programming the conventional 2-bit NROM, the hot electrons injected into the electron capture layer are distributed according to the injection energy. The two bits of the same memory cell are mutually affected by each other to cause the electron secondary effect to link the charge distribution curves thereof. Therefore, during erase operation, the distribution curves of the hot holes injected into the charge capture layer cannot be superimposed with the electron distribution curves causing incomplete erase, or a longer time to erase.

Further, while using the hot electron injection to perform the erase operation, holes are injected into the charge capture layer via the drain side (or source side) and the number thereof are difficult to control. Therefore, excessive or insufficient holes may be injected to the charge capture layer causing over erase or insufficient erase of the memory device. When the over erase or the insufficient erase is serious, reliability of the memory device may be reduced.

In addition, in the conventional NROM, the material of the gate dielectric layer between the control gate and the charge capture layer is silicon oxide. The silicon oxide has a poor isolation effect that is likely to cause contact between the control gate and the charge capture layer, so as to affect reliability of the device.

SUMMARY OF INVENTION

The present invention provides a silicon nitride read only memory (NROM) and a method of fabricating the same. The over erase and insufficient erase are avoided to enhance device reliability.

The present invention further provides an NROM and the method of fabricating the NROM to save multi-bit data in a single cell, so as to increase device integration.

The NROM provided by the present invention comprises a control gate formed on a substrate, a charge capture layer between the control gate and the substrate, a stack dielectric layer between the control gate and the charge capture layer, a source region and a drain region in the substrate at two sides of the charge capture layer, a channel region in the substrate between the drain and source regions, and an isolation region in the charge capture layer. The isolation region partitions the charge capture layer into several blocks to form a charge capture block array. The rows of the charge capture block array are oriented from the source region to the drain region. Each row has two charge capture blocks, while each column includes n (n is a positive integer) charge capture blocks. When the NROM is under the state with any written data, the channel region under the charge capture blocks in the same row has the same threshold voltage, while the channel region under the charge capture blocks in different rows has different threshold voltage.

The above NROM further comprises a tunneling oxide layer between the charge capture layer and the substrate.

In the above structure, the isolation region partitions the charge capture layer into several charge capture blocks to form a multi-bit structure, while the channel region under the charge capture blocks of different rows has different threshold voltage. Therefore, multi-bit data can be saved in a single memory cell to enhance the data storage capacity and integration of the device. Further, as the charge capture layer is partitioned into several charge capture blocks (that is, several bits of the memory cell being partitioned), the problem of secondary electron injection is resolved, and the device reliability is improved.

In addition, by forming stacked ONO layer on the charge capture layer, a better isolation is achieved between the charge capture layer and the control gate, such that the reliability of the memory device is enhanced.

The present invention further provides a method of fabricating a silicon nitride read only memory. A silicon oxide layer and a charge capture layer are formed on a substrate. An isolation region is formed to partition the charge capture layer into a plurality of charge capture blocks. These charge capture blocks form a charge capture block array, which has a row direction from one bit line to another. Each row of the charge capture block array has two charge capture blocks, and each column of the charge capture block array has n (n is a positive integer) charge capture blocks. A stacked dielectric layer is formed on the charge capture layer in a reaction chamber. The stacked dielectric layer and the charge capture layer are then patterned to expose the region for forming bit lines. A control gate is formed on the charge capture layer, and a threshold voltage adjustment step is performed to result in different threshold voltage for the channel regions under the charge capture blocks of different rows.

In the above method, the material of the charge capture layer includes silicon nitride. Further, the method for forming the isolation region includes forming patterned photoresist layer on the charge capture layer that exposes the region predetermined for forming the isolation region, followed by an ion implantation step. Oxygen ions are implanted into the exposed region. An annealing process is then performed allowing the oxygen ions to react with silicon of the charge capture layer to form the isolation region.

In addition, the above method further comprises a step of forming a field oxide layer on the bit lines.

In the above method of fabricating the silicon nitride read only memory, oxygen ions are implanted in the charge capture layer to form an isolation region. The isolation region partitions the charge capture layer into a plurality of charge capture blocks. By adjusting the channel regions under the charge capture blocks of different rows to have different threshold voltages, a memory cell thus attains the multi-bit structure. Therefore, the storing bit number for one memory cell is increased without increasing integration of the memory device. Further, as the isolation region partitions the charge capture layer into a plurality of independent regions (that is, each bit of the memory cell is separated from the other), the so-called secondary electron injection is avoided.

In the above method of fabricating NROM, a stacked dielectric layer of oxide/nitride/oxide is formed between the charge capture layer and the control gate, such that the isolation is improved, and the device reliability is enhanced.

In one embodiment of the present invention, the oxide/nitride/oxide layer can be formed in an in-situ manner. That is, various gases are introduced into the same reaction chamber to perform various reactions in different steps. Therefore, the requirement of changing the reaction chamber or furnace for performing different reactions is not required. The process can thus be simplified.

BRIEF DESCRIPTION OF DRAWINGS

The above objects and advantages of the present invention will be become more apparent by describing in detail exemplary embodiments thereof with reference to the attached drawings in which.

DETAILED DESCRIPTION

Figure 1A:
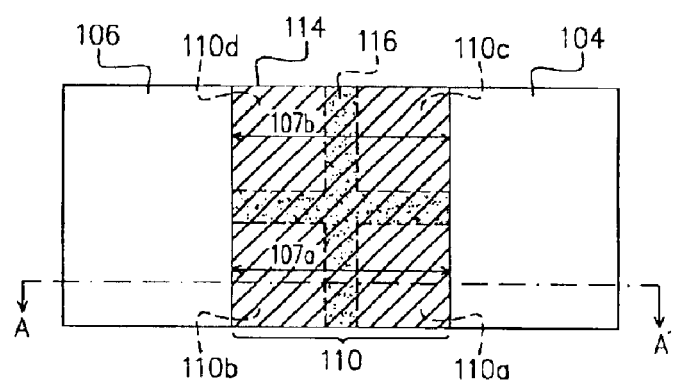
FIG. 1A shows a top view of a silicon nitride read only memory (NROM) in one embodiment of the present invention.

The structure of a silicon nitride read only memory (NROM) provided by the present invention is described in detail with reference to the accompanied drawings as follows. FIGS. 1A (top view) and FIG. 1B (cross-sectional view) show an embodiment of a NROM provided by the present invention. FIGS. 2A and 2B show another embodiment of an NROM provided by the present invention. In FIGS. 2A and 2B, similar devices are denoted by the same numeral references as those denoted in FIGS. 1A and 1B.

Figure 1B:
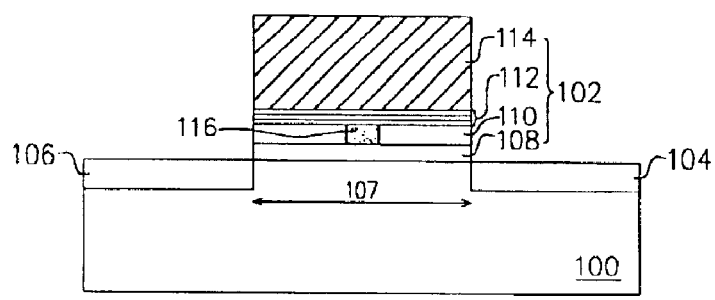
FIG. 1B shows a cross-sectional view along the line A–A' of FIG. 1A.
Figure 2A:
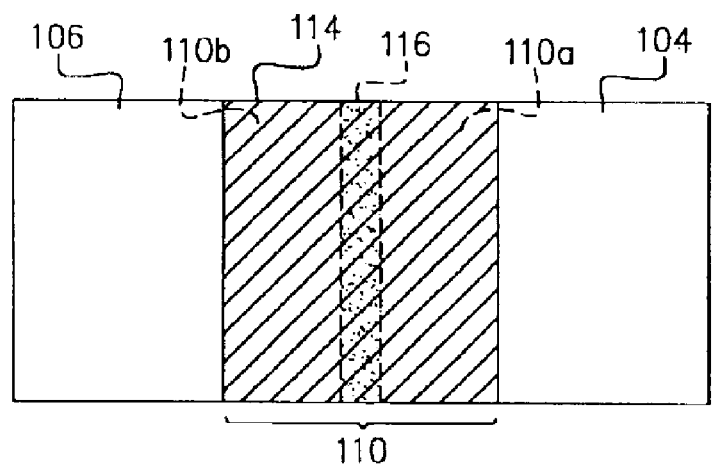
FIGS. 2A and 2B are top views of an NROM in another embodiment of the present invention.
Figure 2B:
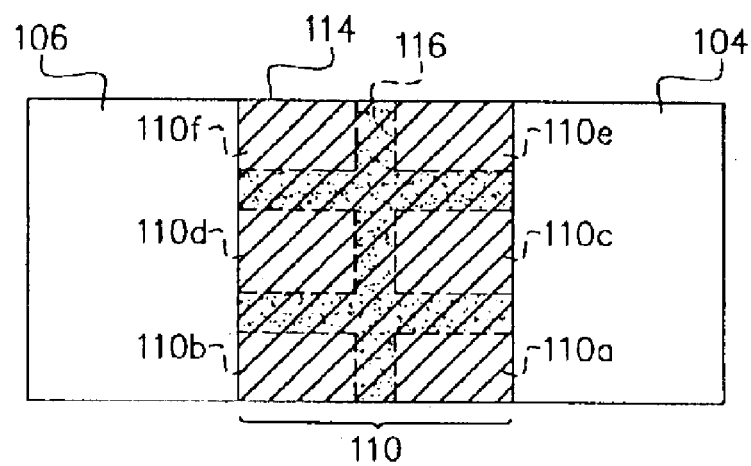

Referring to FIGS. 1A and 1B, the NROM comprises a substrate 100, a gate structure 102, a source region 104, a drain region 106 and a channel region 107. The gate structure 102 is formed on the substrate 100. The source region 104 and the drain region 106 are formed in the substrate 100 at two sides of the gate structure 102. The channel region 107 is formed in the substrate 100 under the gate structure 102 between the source region 104 and the drain region 106.

The gate structure 102 includes a tunneling oxide layer 108, a charge capture layer 110, a stacked dielectric layer 112 and a control gate 114. The control gate 114 is formed on the substrate 100. The charge capture layer 110 is formed between the control gate 114 and the substrate 100. The stacked dielectric layer 112 is formed between the control gate 114 and the charge capture layer 110. The material of the stacked dielectric layer 112 includes silicon oxide/silicon nitride/silicon oxide (ONO), for example. The tunneling oxide layer 108 is formed between the charge capture layer 110 and the substrate 100. An isolation region 116 is formed in the charge capture layer 110 to separate the charge capture layer 110 into a plurality of charge capture blocks, so as to form the multi-bit structure. The charge capture blocks form an array with the row direction oriented from the source region 104 to the drain region 106. In the array of charge capture blocks, each row comprises two charge capture blocks, and each column comprises a plurality of charge capture blocks. When there is no data written into the NROM, the channel regions under the charge capture blocks of the same row have the same threshold voltage. In contrast, the channel regions under the charge capture blocks of different rows have different threshold voltages. In this embodiment, the charge capture layer 110 is partitioned into four charge capture blocks 110a, 110b, 110c and 110d to form a 2×2 array. Therefore, before writing the memory cell, the channel regions 107a under the charge capture blocks 110a and 110b of the first row have the same threshold voltage, and the channel regions 107b under the charge capture blocks 110c and 110d of the second row have the same threshold voltage. However, the channel regions 107a under the charge capture blocks 110a and 110b of the first row has a threshold voltage different from that of the channel regions 107b under the charge capture blocks 110c and 110d.

In the above structure, the isolation region 116 in the charge capture layer 110 partitions the charge capture layer 110 into four capture blocks 110a, 110b, 110c and 110d to form a four-bit structure. The channel regions 107a under the charge capture blocks 110a and 110b have a threshold voltage different from that of the channel regions 107b under the charge capture blocks 110c and 110d. Therefore, four-bit data can be saved in a single memory cell to enhance device integration. Further, as the charge capture layer 110 is partitioned into four independent charge capture blocks (that is, the four bits are separate from each other), the secondary electron injection is avoided to enhance device reliability.

In the above structure, a charge capture layer partitioned into four charge capture blocks is used as an example for describing the present invention. The charge capture layer 110 can also be partitioned into two charge capture blocks (such as the charge capture blocks 110a and 110b as shown in FIG. 2A) or more than four charge capture blocks (such as 6 charge capture blocks 110a to 110f as shown in FIG. 2B). The channel region under charge capture rows of different rows are then adjusted with different threshold voltages to form the multi-bit structure.

In addition, the ONO stacked dielectric layer 110 formed on the charge capture layer 110 provides an improved isolation effect between the charge capture layer and the control gate, so that the device reliability is enhanced.

In the above description, the structure of an NROM is provided. The method of fabricating an NROM according to the present invention is described as follows. FIGS. 3A to 3G shows top view of an NROM formed in various stages of the process. FIGS. 4A to 4G are cross-sectional views along the line B–B" of FIGS. 3A to 3G, respectively.

Figure 3A:
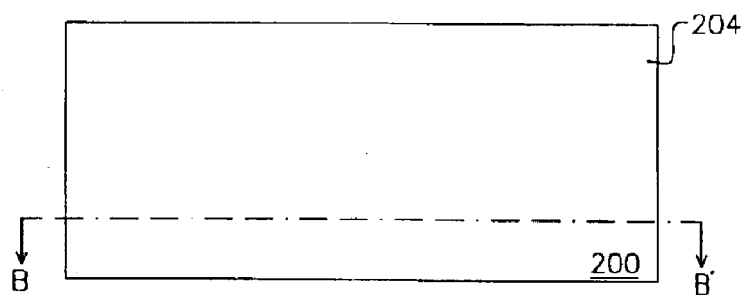
FIGS. 3A to 3G are top views showing the NROM formed in various stages of process.
Figure 4A:
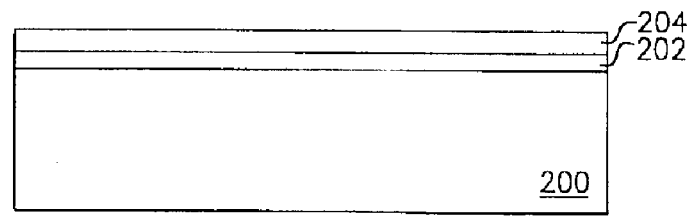
FIGS. 4A to 4G are cross-sectional views along the line B–B" as shown in FIGS. 3A to 3G.

Referring to FIGS. 3A and 4A, a substrate 200 is provided. The substrate 200 includes silicon substrate, for example. A silicon oxide layer 202 functioning as a tunneling oxide layer is formed on the substrate 200. The method for forming the silicon oxide layer 202 includes thermal oxidation, for example.

A charge capture layer 204 is formed on the silicon oxide layer 202. The material of the charge capture layer 202 includes silicon nitride, and the method for forming the charge capture layer 202 includes chemical vapor deposition, for example.

Figure 3B:
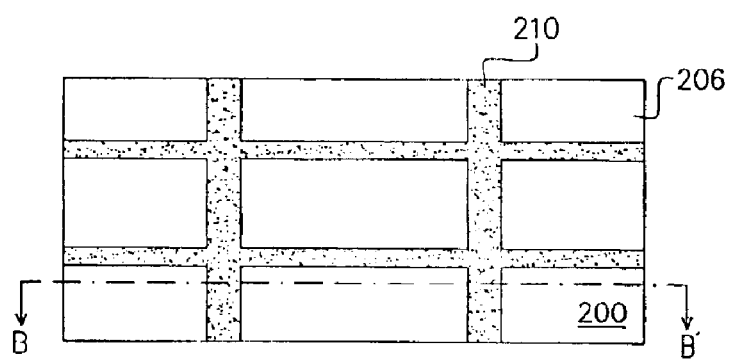
Figure 4B:
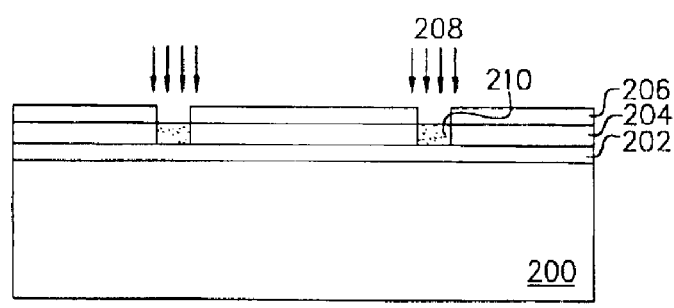

Referring to FIG. 3B and FIG. 4B, a patterned photoresist layer 206 is formed on the charge capture layer 204. The patterned photoresist layer 206 exposes the region of the charge capture layer predetermined for forming the isolation region.

A step of ion implantation 208 is performed. A patterned photoresist layer 206 is used as a mask to implant oxygen ions into the charge capture layer 204 exposed by the photoresist layer 206. Thereby, an oxygen doping region 210 is formed in the charge capture layer 202. The dosage of the oxygen ions is about $1 \times 10^{18}$ atoms/cm$^2$ to about $2 \times 10^{18}$ atoms/cm$^2$, and the implantation energy thereof is about 20 KeV to about 80 KeV.

Figure 3C:
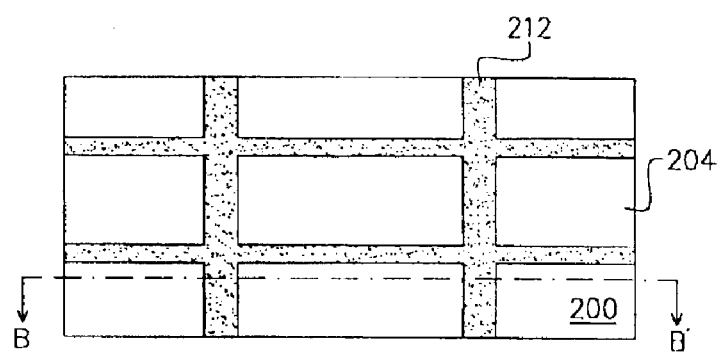
Figure 4C:
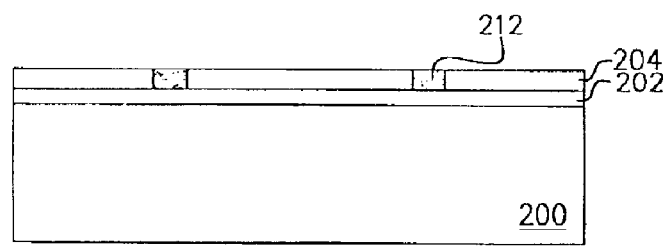

Referring to FIGS. 3C and 4C, the pattern photoresist layer 206 is removed. An annealing process is performed to form an isolation region 212 by reacting the silicon in the charge capture layer 204 into silicon oxide. The temperature for performing the annealing process is about 950° C. to about 1150° C. The isolation region 212 partitions the charge capture layer into a plurality of charge capture blocks. In this embodiment, the isolation region 212 partitions the charge capture layer 204 into four charge capture blocks for forming a four-bit memory cell.

Figure 3D:
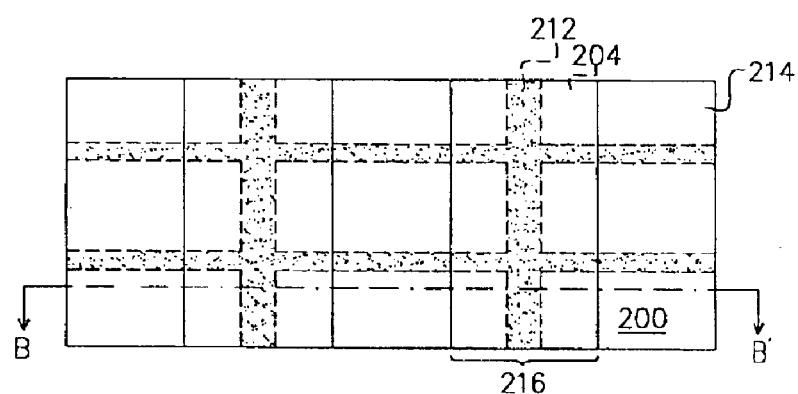
Figure 4D:
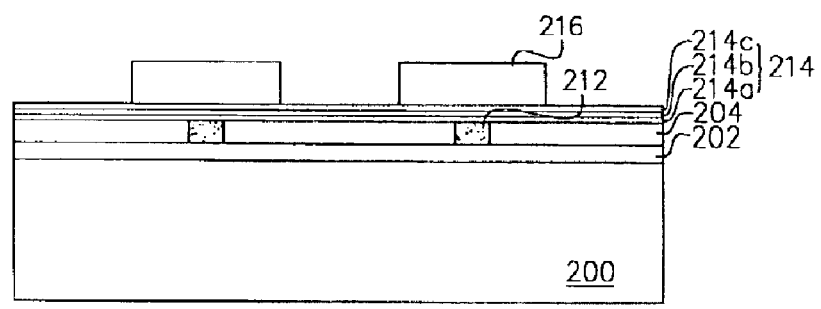

Referring to FIG. 3D and FIG. 4D, a stacked dielectric layer 214 is formed on the charge capture layer 204. The stacked dielectric layer 214 is made of silicon oxide/silicon nitride/silicon oxide with a thickness of about 60 angstroms to about 90 angstroms. The stacked dielectric layer 214 is formed in a single wafer deposition reaction chamber, for example.

The method for forming the stacked dielectric layer 214 includes disposing the substrate 200 into a wafer deposition reaction chamber, followed by steps of forming a silicon oxide layer 214a on the charge capture layer 204 and the isolation region 212. The method for forming the silicon oxide layer 214a includes in-situ steam generation (ISSG), for example. The thickness of the silicon oxide layer 214a is about 30 angstroms.

In the same reaction chamber, a silicon nitride layer 214b is formed on the silicon oxide layer 214a. The method for forming the silicon nitride 214b includes introducing process gases of dichloromethane ($SiH_2Cl_2$) and ammonia ($NH_3$) into the reaction chamber for reaction. The reaction temperature is about 600° C. to about 750° C., such that the dichloromethane is reacted with ammonia to form the silicon nitride layer 214b with a thickness of about 10 angstroms to about 30 angstroms on the silicon oxide layer 214a.

Figure 3E:
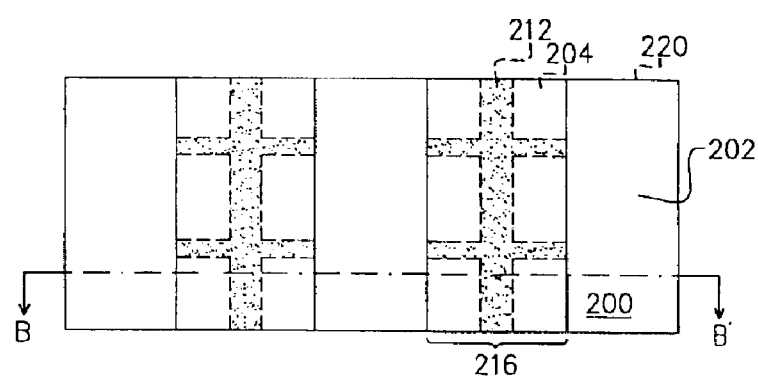
Figure 4E:
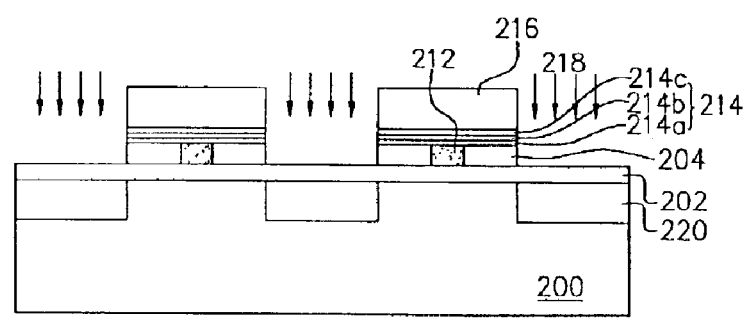

In the same reaction chamber, a silicon oxide layer 214c is formed on the silicon nitride layer 214b by introducing dichloromethane and nitrous oxide ($NO_2$). The reaction temperature is about 700° C. to about 850° C., such that the dichloromethane is reacted with nitrous oxide to form the silicon oxide layer 214c on the silicon nitride layer 214b. The thickness of the silicon oxide layer 214c is about 20 angstroms to about 40 angstroms. A patterned photoresist layer 216 is formed on the stacked dielectric layer 214. The patterned photoresist layer 216 exposes the stacked dielectric layer 214 over the regions for forming bit lines. The patterned photoresist layer 216 is then used as a mask for removing the stacked dielectric layer 214 and the charge capture layer 204 to expose the regions of the substrate 200 for forming bit lines as shown in FIGS. 3E and 4E. An ion implantation is performed using the patterned photoresist layer 216 as a mask. The doped regions 220 (bit lines) are then formed in the substrate 200 at two sides exposed by the photoresist layer 216. The implanted ions include arsenic ions with a dosage of about $2 \times 10^{15}$ atoms/cm$^2$ to about $4 \times 10^{15}$ atoms/cm$^2$, and the implantation energy is about 50 KeV.

Figure 3F:
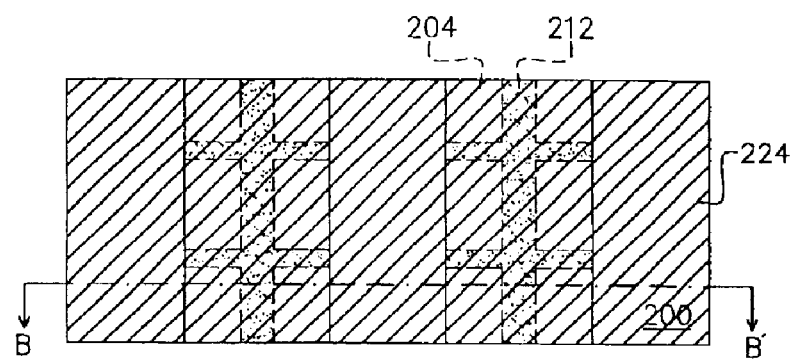
Figure 4F:
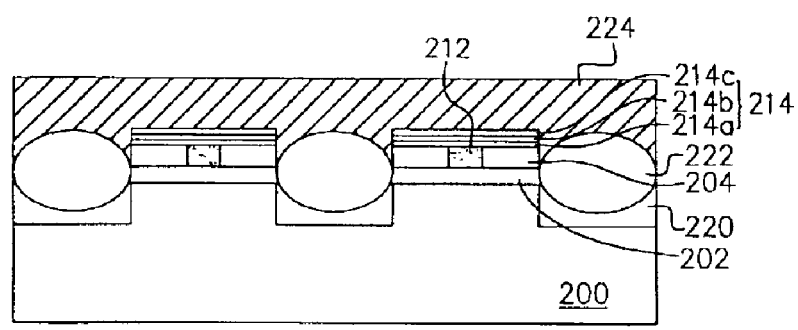

Referring to FIGS. 3F and 4F, the photoresist layer 216 is removed, and a thermal process is performed to form a field oxide layer 222 on the doped regions 220. Further, the ions in the doped regions 220 are also activated. The field oxide layer 222 is used to isolate the doped regions 220 (bit line) with the control gate (the word line) formed subsequently.

A conductive layer 224 such as a doped polysilicon layer is formed over the substrate 200. An in-situ ion implantation and chemical vapor deposition are used to form the conductive layer 224, for example.

Figure 3G:
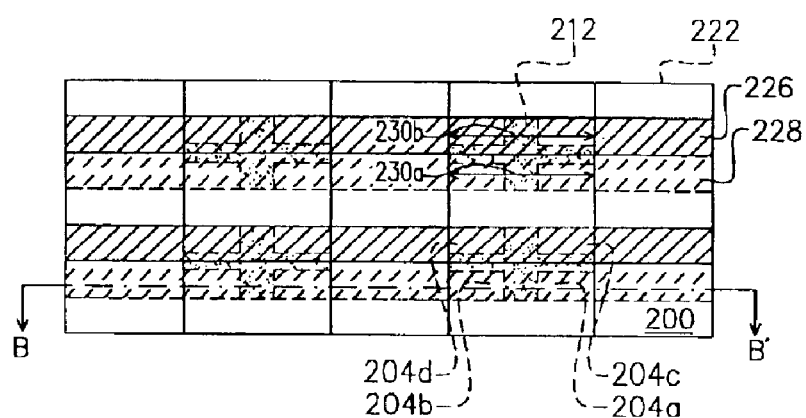
Figure 4G:
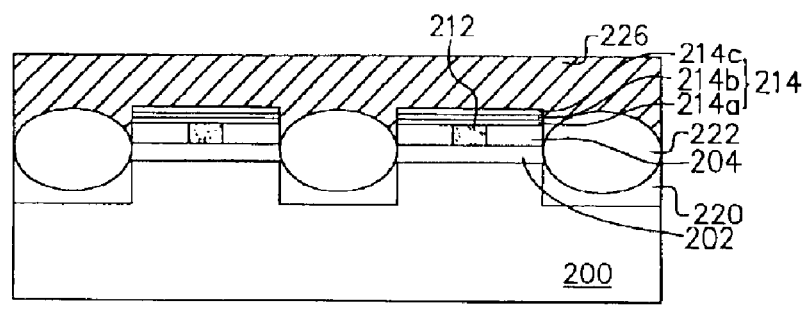

Referring to FIGS. 3G and 4G, the conductive layer 224 is patterned to define a control gate 226 (word line). While defining the conductive layer 224, the same mask is used to define the stacked dielectric layer 214, the charge capture layer 204 and the dielectric layer 202 for forming the gate structure. That is, the gate structure of the NROM includes the control gate 208, the stacked dielectric layer 214, the charge capture layer 204 and the oxide layer 202 in the present invention. In this embodiment, the charge capture layer 204 for each memory cell includes at least four independent charge capture blocks 204a, 204b, 204c and 204d partitioned by the isolation region 212 to form a 2×2 array.

A step of adjusting threshold voltage is performed. A patterned photoresist layer 228 is formed over the substrate 200. The photoresist layer 228 exposes at least the control gate 228 over the charge capture blocks 204c, 204d. An ion implantation process is performed using the photoresist layer 228 as a mask, such that the channel regions 230b under the charge capture blocks 204c and 204d are implanted with ions to adjust the threshold voltages thereof. Therefore, the channel regions 230b under the charge capture blocks 204c, 204d have a threshold voltage different from that of the channel regions 230a under the charge capture blocks 204a and 204b. A single memory cell can thus save four-bit data. The subsequent processes are known to the person of ordinary skill and are not further described.

In this embodiment, oxygen ions are implanted in the charge capture layer 204 to form the isolation region 212 that partitions the charge capture layer 204 into four charge capture blocks to form a multi-bit structure. Therefore, without increasing volume of the memory cell, more bits of data can be stored, and device integration is enhanced. Further, the four charge capture blocks are independent to each other to avoid the secondary electron injection.

In addition to the above four blocks, an isolation region may be formed to partition the charge capture layer into another number of charge capture blocks (for example, six or eight). Similarly, the channel regions under the charge capture blocks of different rows have different threshold voltages to form the multi-bit structure.

In the above embodiment, the ONO stacked dielectric layer 214 provides a better isolation effect between the charge capture layer 204 and the control gate 226, such that device reliability is enhanced.

Further, each layer of the ONO stacked dielectric layer 214 can be formed in-situ, that is, in the same reaction chamber by introducing various gases to perform respective reactions. Therefore, unlike the conventional method that requires multiple reaction chambers, the process is simplified.

While the present invention has been particularly shown and described with reference to preferred embodiments thereof, it will be understood by those of ordinary skill in the art that various changes in form and details may be made therein without departing from the spirit and scope of the present invention as defined by the appended claims.

What is claimed is:

1. A method of fabricating a silicon nitride read only memory, comprising:

providing a substrate;

forming a silicon oxide layer on the substrate;

forming a charge capture layer on the silicon oxide layer;

forming an isolation region in the charge capture layer to partition the charge capture layer into a plurality of charge capture blocks arranged in an array with a plurality of rows extending from one predetermined bit line to another predetermined bit line, and a plurality of columns each having n (n is a positive integer) charge capture blocks;

forming a stacked dielectric layer on the charge capture layer in a reaction chamber;

patterning the stacked dielectric layer and the charge capture layer to expose regions of the substrate predetermined for forming the bit lines;

forming the bit lines in the substrate at two sides of the charge capture layer;

forming a control gate on the stacked dielectric layer; and performing a threshold voltage adjustment step allowing channel regions under the charge capture blocks of different rows to have different threshold voltages.

2. The method as claimed in claim 1, wherein the step of forming the charge capture layer includes forming a silicon nitride layer.

3. The method as claimed in claim 1, wherein the step of forming the isolation region includes:

forming a patterned photoresist layer on the charge capture layer, the photoresist layer exposing a region predetermined for forming the isolation region;

performing an ion implantation step for implanting dopant in the exposed region; and performing an annealing process to react the dopant with silicon of the charge capture layer.

4. The method as claimed in claim 3, wherein the step of ion implantation further comprises implanting oxygen ions into the exposed region.

5. The method as claimed in claim 4, wherein the step of ion implantation further comprises implanting the oxygen ions with a dosage of about $1 \times 10^{18}$ atoms/cm$^2$ to about $2 \times 10^{18}$ atoms/cm$^2$.

6. The method as claimed in claim 5, wherein the step of ion implantation further comprises implanting the oxygen ions with an implantation energy of about 20 KeV to about 80 KeV.

7. The method as claimed in claim 4, wherein the annealing step is performed at about 950° C. to about 1150° C.

8. The method as claimed in claim 4, further comprising a field oxide layer on the bit lines after forming the bit lines before forming the control gate.

9. The method as claimed in claim 1, wherein the step of forming the stacked dielectric layer further comprising:

forming a first silicon oxide layer on the charge capture layer in the reaction chamber;

forming a silicon nitride layer on the first silicon oxide layer in the reaction chamber; and forming a second silicon oxide layer on the silicon nitride layer in the reaction chamber.

10. The method as claimed in claim 9, wherein the step for forming the first silicon oxide layer comprises in-situ steam generation.

11. The method as claimed in claim 9, wherein the step of forming the first silicon oxide layer comprises introducing dichloromethane and ammonia into the reaction chamber to form the first silicon oxide layer.

12. The method as claimed in claim 9, wherein the step of forming the silicon nitride layer comprises introducing dichloromethane and nitrous oxide into the reaction chamber for forming the silicon nitride layer.

13. A method of fabricating a silicon nitride read only memory, comprising:

providing a substrate;

forming a silicon oxide layer on the substrate;

forming a charge capture layer on the silicon oxide layer;

forming an isolation region in the charge capture layer to partition the charge capture layer into a plurality of charge capture blocks arranged in an array with a plurality of rows extending from one predetermined bit line to another predetermined bit line, and a plurality of columns each having n (n is a positive integer) charge capture blocks;

forming a stacked dielectric layer on the charge capture layer in a reaction chamber;

patterning the stacked dielectric layer and the charge capture layer to expose regions of the substrate predetermined for forming the bit lines;

forming the bit lines in the substrate at two sides of the charge capture layer;

forming a control gate on the stacked dielectric layer;

forming a first dielectric layer on the charge capture layer in a reaction chamber;

forming a second dielectric layer on the first dielectric layer in the reaction chamber by introducing a first gas therein;

forming a third dielectric layer on the second dielectric layer in the reaction chamber by introducing a second gas therein;

patterning the third, second, first dielectric layers and the charge capture layer to expose regions predetermined for forming the bit lines;

forming the bit lines in the substrate at two sides of the charge capture layer;

forming a control gate on the third dielectric layer; and performing a threshold voltage adjustment step allowing channel regions under the charge capture blocks of different rows having different threshold voltages.

14. The method as claimed in claim 13, wherein the step of forming the first dielectric layer includes in-situ steam generation.

15. The method as claimed in claim 13, wherein the first gas includes dichloromethane and ammonia.

16. The method as claimed in claim 13, wherein the second gas includes dichloromethane and nitrous oxide.

17. The method as claimed in claim 13, wherein the step of forming the first dielectric layer includes forming a silicon oxide layer.

18. The method as claimed in claim 13, wherein the step of forming the second dielectric layer includes forming a silicon nitride layer.

19. The method as claimed in claim 13, wherein the step of forming the third dielectric layer includes forming a silicon oxide layer.

* * * * *